Figure 1:
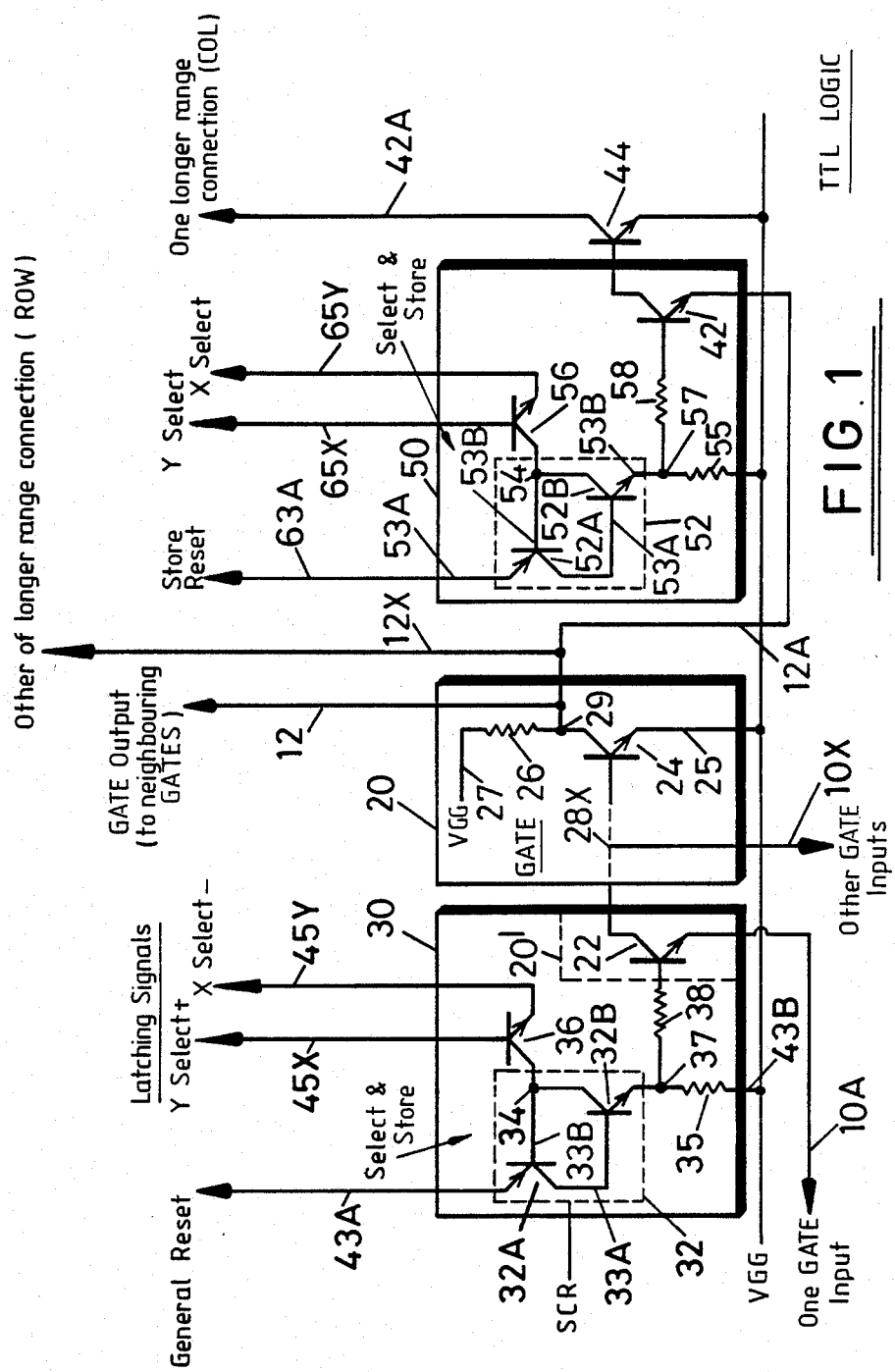

United States Patent [19]

Austin

[11] Patent Number: 4,829,202
[45] Date of Patent: May 9, 1989

[54] SEMICONDUCTOR INTEGRATED BIPOLAR SWITCHING CIRCUIT FOR CONTROLLING PASSAGE OF SIGNALS

[75] Inventor: Kenneth Austin, Hartford, United Kingdom

[73] Assignee: Pilkington Micro-Electronics Limited, United Kingdom

[21] Appl. No.: 90,936

[22] Filed: Aug. 28, 1987

[30] Foreign Application Priority Data

Sep. 4, 1986 [GB] United Kingdom ............... 8621357

[51] Int. Cl.$^4$ ................... H03K 17/62; H03K 19/092
[52] U.S. Cl. .................................... 307/465; 307/454; 307/466; 307/243; 307/284
[58] Field of Search ............... 307/454, 465, 466, 242, 307/243, 272 R, 284

[56] References Cited

U.S. PATENT DOCUMENTS

| | | | |
|---|---|---|---|
| 3,790,823 | 2/1974 | Briley | 307/243 X |
| 3,798,468 | 3/1974 | Elshuber | 307/242 |
| 3,863,229 | 1/1975 | Gersbach | 307/284 X |
| 4,031,413 | 6/1977 | Ohhinata et al. | 307/284 X |
| 4,154,978 | 5/1979 | Tu | 307/242 X |
| 4,354,266 | 10/1982 | Cooperman et al. | 307/243 X |

FOREIGN PATENT DOCUMENTS 2180382 3/1987 United Kingdom .
2182220 5/1987 United Kingdom .

OTHER PUBLICATIONS

Hlasnicek, "Electronic Programmable Segmenting of Product Terms in Arrays", IBM T.D.B., vol. 19, No. 5, Oct. 1976, p. 1599.

Primary Examiner—David Hudspeth
Attorney, Agent, or Firm—Willian, Brinks, Olds, Hofer, Gilson & Lione

[57] ABSTRACT

Selectable signal connection provisions are made for passing signals relative to logic circuitry of digital bipolar semiconductor integrated circuits. Each such provision has formed on the chip for each selectable signal connection, an active circuit element whose conduction state relative to signals concerned is controlled by applied circuit conditions. The conditions are selected by operative control circuitry responsive to a configuring or selection signal applied temporarily thereto for switching between stable states and thus determining the conduction state of the active circuit element.

11 Claims, 2 Drawing Sheets

TRUE AND INVERTING NAND GATE

AND / EXCLUSIVE-OR / HALF ADDER

| S1 — S4 ALL OFF | SR FLIP FLOP |
| S1          ON  | CLOCKED SR |
| S1 — S3 ALL ON  | T-TYPE |
| S1 + S4     ON  | D-TYPE |

SEMICONDUCTOR INTEGRATED BIPOLAR SWITCHING CIRCUIT FOR CONTROLLING PASSAGE OF SIGNALS

This invention relates to electronic circuitry of semiconductor integrated circuits (chips) and has particular, but not necessarily exclusive, reference to controlling signal passage in relation to logic circuitry of digital bipolar chips.

As background to this invention, it will be appreciated readily that many digital chips (whether of bipolar or of field effect types) incorporate at least some of the various available types of two state circuits (whether monostable or bistable, commonly called "flip-flops") and one or more of the various available types of logic gate circuits (for example AND, OR, EXCLUSIVE-OR, etc and/or their NOT-variants). A specifically designed chip, often-called "full-custom", can achieve maximum utilisation of available chip area and complexity of system implementation by appropriately combining various two-state and logic circuits. It is, however, well-known that appropriate combinations of chosen types of logic gate circuits enable achievement of the same effect as specific two-state circuits. Such capability is particularly exploited in what are often called "semi-custom" chips of the uncommitted logic array type (ULAs). ULAs are first made with a large number of unconnected logic circuits distributed over their available chip areas, and can be configured to users' requirements by application of a final metallisation layer making desired connections of inputs and outputs of the logic gate circuits. Designing metallisation masks for ULAs is time-consuming and expensive, and designing "full-custom" chips is even more so.

At the other extreme of digital chips (again whether of bipolar or of field effect types) are so-called programmable gate arrays (PGAs) where the usable chip area tends to be occupied to a large extent by selectable interconnect provisions between all inputs and outputs of a plurality of logic gate circuits. Such circuits allow the user to decide what connections are to be made, normally to remain after disabling other possible connections. PGAs have generally had very many fewer logic gate circuits than ULAs, and disablement of unwanted connections has normally been irreversible.

Our copending British patent application No. 8621818 (published under No. 2180382A) relates to chips with inherent user-configurability as for PGAs but with the possibility of relatively large numbers of logic gate circuits so as to bring PGAs closer to the kind of overall system implementation capability presently associated with ULAs, albeit that, for equivalence, use of a larger chip is to be expected. As described in that patent application, it is possible to provide a capability for re-configuring chips at will, i.e. to select possible connections on a reversible basis.

Our copending patent application No. 8621819 (published under No. 2182220A) concerns particularly efficient selectable signal-pass circuitry for MOS field effect type chips.

One object of this invention is to provide for selective control of connections to inputs or outputs of logic gate circuits of digital bipolar chips, though other and further uses are to be expected.

According to this invention, there is provided a digital bipolar semiconductor integrated circuit comprising logic circuitry having selectable signal connection provisions for passing signals relative to said logic circuitry, such provisions comprising, formed on the chip for each selectable signal connection, an active circuit element whose conduction state relative to signals concerned is controlled by applied circuit conditions and operative control circuitry responsive to a configuring or selection signal applied temporarily thereto for switching between stable states of the operative control circuitry that determine said applied circuit conditions and thus the conduction state of the active circuit element.

The selectable signal connection provisions can be relative to inputs of constituent logic gates or other logic circuits, or to their outputs, or to logic cells whose function is reconfigurable. A connection from the operative control circuitry to selection configuring signal input provision of the chip enables selection from off the chip.

In relation to certain embodiments of the present invention we find it convenient to view each operative control circuitry generally as an active latch circuit, or a part thereof, that is responsive to a trigger signal to go into (or conceivably out of) a conduction state by its own action and, once triggered, to remain in that state by means of other normally applying circuit conditions.

For silicon as the semiconductor material, the required action of the operative control circuitry would be satisfied by a four-layer formation known as a silicon controlled rectifier (SCR). There is activity in the art directed towards implementing SCRs in silicon chips for the purposes of utilising SCRs as active components of memory cells, particularly in relation to read-write stores (RAMs). Such utilisation of SCRs is, however, of a different nature from that proposed herein. Thus, basic requirement and action of RAMs is to set up (write) a particular binary value representative state at each memory cell and subsequently to sense (read) that state at will. By contrast, we are providing a selectable connection for controlling passage of bit signals to or from system logic circuits, i.e. after the manner of a transmission gate and to select a conduction state that will prevail throughout subsequent cycles of operation normally related to data flow in accordance with clock pulses.

Practical realisation of each operative control circuitry can be as a four-layer formation of SCR or similar type, or by a functional equivalent. One such equivalent comprises two complementary transistors each connected by its base to the collector of the other and triggered at one of the base connections to latch one emitter to a particular one of two possible voltage conditions. Such voltage condition can then determine the conduction state of a signal-pass transistor constituting said active circuit element and connected to receive the signal to be passed.

At least where used for input to a logic circuit input, the signal-pass transistor can itself constitute a part of the associated logic gate circuit, as will be described for input stages of a NAND gate of TTL type having another transistor controlled from the signal-pass transistors.

Essentially similar circuit configuration can be used to control gating of signals out of a branch taken from the normal output of the logic gate circuit. More than one such output branch can be selectably controlled as can more than one input connected into the gate circuit, say at the junction to said other transistor thereof.

Whilst specific mention has just been made of TTL (transistor-transistor logic), which could be of Schottky enhanced type for lower power consumption, the invention could be applied to other bipolar circuitry, for example that known as emitter-coupled-logic (ECL).

Figure 2A:
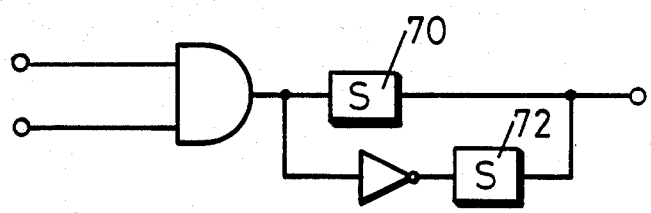
Figure 2B:
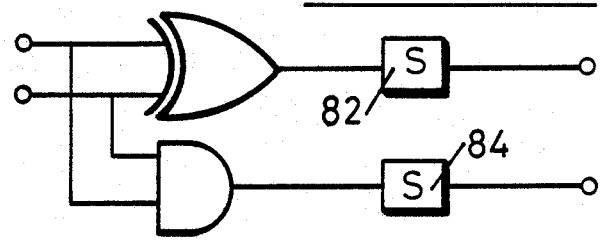
Figure 2C:
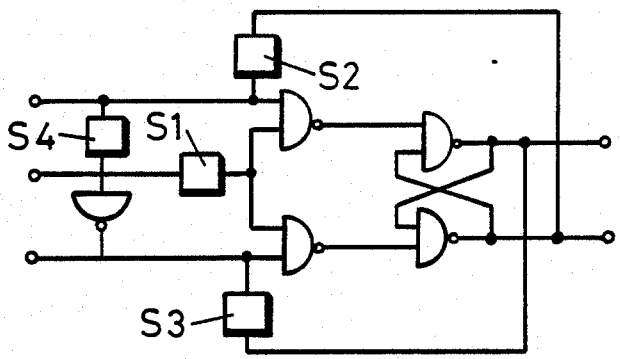

Specific implementation of this invention will now be described by way of example with reference to the accompanying drawing, in which:

FIG. 1 shows a circuit diagram of a part of a NAND gate showing one selectable input thereto and one selectable output branch; and FIG. 2A–2C show selectively configurable logic circuitry.

In FIG. 1, passage of bit signals is to be controlled on lines 10A and 12A serving as input and branch output, respectively, of a NAND logic gate circuit whose output stage is shown at 20. Provision for other gate input(s) is indicated at 10X and for other branch output(s) at 12X. A normal or true gate output is indicated at 12, which may itself be branched for unselectively servicing inputs of one or more other gate circuits (not shown) as desired within the limits of fan-out characteristics of whatever the semiconductor system is used.

The input 10A is shown connected as a gate input to be rendered selectively conductive by way of npn transistor 22 as the above-mentioned active circuit element serving for signal pass purposes. In the configuration shown, the transistor 22 actually cooperates with npn transistor 24 to provide the specific desired NAND gate operation, i.e. is an input stage of the NAND gate. Thus, whilst it is considered convenient to show the transistor 22 within input control circuit 30 as it is selectable to serve a signal-pass purpose, the dashed box 20' is used to represent its dual role as a NAND gate input stage.

The operative control circuitry 32 is shown as a complementary pair of transistors 32A (pnp) and 32B (npn) having their bases each connected to the collector of the other and their emitters connected at 33A and 33B. That configuration can be a formation as-made on the chip or can be considered as an equivalent circuit for a four-layer formation such as a silicon controlled rectifier (SCR). In any event, appropriate voltage conditions, will result in the circuit 30 acting as a latching circuit when triggered by a prescribed temporary signal condition applied at 34.

As shown, normal applied voltage conditions are relatively high at the emitter of transistor 32A, applied over line 43A, and relatively low at the emitter of transistor 32B, applied over resistor 35 from line 43B to voltage rail VGG. Then, latching action is into conduction, which is achieved selectively on a coincident current basis by way of a selection transistor 36 indicated as being of npn type with its collector connected to trigger 34, and its base and emitter electrodes connected to lines 45X and 45Y for relatively high and low selection signals. Temporary application of a triggering condition by coincident energisation of lines 45X and 45Y will initiate latching conduction action of the control circuit formation 32. Voltage at 37 will rise to represent an applied circuit condition representing selection for conduction, i.e. signal-pass purposes, and is shown applied over resistor 38 to the base of the transistor 22, which is thereby renderer conductive thus enabling input signal passage to the gate from input 10A.

The control circuit formation 32 will remain latched after the temporary signal condition at 34 is removed and will only reverse its state when the line 43A goes low, which can be done deliberately for reset purposes or may happen at interruption of power supply for any reason.

Regarding NAND gate action, it will be noted that the npn transistor 22 has its emitter connected to the gate input line 10A and its collector connected to the base of a further npn transistor 24, whose emitter is connected at 25 to the low voltage rail VGG and whose collector is connected by way of resistor 26 to high voltage line 27. Other gate inputs 10X are indicated to node 28X in the connection between the collector of transistor 22 and the base of the further transistor 24, and there could be at least six such inputs, though that number should not be taken as required or limiting. The gate output 12 is taken at 29 from the collector of the transistor 24 and will be low or high according to whether the transistor 24 is conducting or not, i.e. high whenever any of the gate inputs 10A, 10X goes low, and low only when all the gate inputs are high.

It will be appreciated that every input 10X will have a selection control circuit similar to that described for 30, and that only selected inputs will be operative relative to the gate output stage 20, i.e. any inputs 10A, 10X for which its associated transistor 22 is not rendered conductive will have no effect on the NAND gate action. For selected inputs, there will, however, be true logic action according to the bit signals applied to them.

Turning to output branch 12A, a selection circuit 50 similar to the input selection circuit 30 is shown, references being advanced by twenty. Accordingly, if selected by triggering at 54, transistor 42 will be rendered conductive, in turn causing inverting transistor 44 to be conducting or not in accordance with logic low (binary "0") or logic high binary "1") on line 12A, thereby transmitting the inverted state of gate output 12 directly to line 42A. Other branch outputs can be similarly serviced via further circuitry similar to that referenced 50. Each such branch output is of open-collector configuration and allows what is in effect a wired-OR type output capable or multiple line driving.

One application evisaged is, of course, in relation to PGAs or other programmable chips known as programmable logic arrays (PLAs) or programmable array logic (PAL), particularly of the improved type of our patent application No. 8621818 where the logic gates are distributed substantially evenly in a matrix array. Then, each logic gate site could correspond to FIG. 1, say with some inputs 10A, 10X directly from outputs of prescribed other gates, and other inputs from longer range connection paths (typically row and column following) to which branch outputs 12A, 12X can also be selectably connected.

In one preferred arrangement having a matrix array of logic gates, a typical gate will have its direct output (12) connected to inputs of neighbouring gates, including gates next to it in the same column, the next following gate in the same row, and, advantageously, the next-but-one following gate in the same row. Also, that typical gate will have two selectable output branches (12A and 12X) connected (as at 42A) to different ones of row and column conductors crossing at the gate. Correspondingly, such a preferred gate will have six selectable inputs each similar to 10A and associated selection circuitry 30. Two inputs will be from next gates in the same column, one from next preceding gate in the same row, one from next-but-one preceding gate in the same row, and two from said row and column conductors. That arrangement is, of course, as described in our copending application No. 8621818 where adjacent rows of gates have their outputs going in opposite directions.

Self-evidently, there are other applications wherever user or machine selection of connections to modify or control a chip's action is desirable. For example, it may be desired to provide complex and configurable logic cells, which clearly offer scope for using embodiments of this invention to set up desired ones of possible connections, for particular logic configurations, say instead of signal-path-switching type circuits for choosing which of possible outputs shall receive an input signal. Very simple examples are shown in FIGS. 2A, B, C. In FIG. 2A, selection circuitry (described above for 30 or 50) could be used at 70, 72 to allow choice of a true AND function or a NAND function at a single output.

In FIG. 2B, selection circuitry can be used relative to a half-adder circuit on it outputs (see 82, 84) to give a choice of half-adder (both 82 and 84 conducting) on both outputs, or Exclusive-OR (only 82 conducting) or AND (only 84 conducting) functions on alternative outputs.

In FIG. 2C, selection circuitry can be used relative to flip-flop circuitry and selection circuitry this time shown as crosses and labelled S1 and S4. A basic SR flip-flop obtains if all selection circuits S1 to S4 are off, a clocked SR flip-flop if only S1 is conducting, a D-type when only S1 and S4 are conducting, and a T-type when only S4 is off.

I claim:

1. A digital bipolar semiconductor integrated circuit comprising logic circuitry having selectable signal connection provisions for passing bit signals relative to said logic circuitry, such provisions comprising, formed on the chip for each selectable signal connection: an active circuit element, whose conduction state relative to said bit signals is controlled by conduction control signals; and operative control circuitry responsive to a configuring or selection signal applied temporarily thereto for switching between stable states of the operative control circuitry that determine said conduction control signals and thus the conduction state of the active element to selectively pass said bit signals in dependence on the stable state obtaining.

2. A digital bipolar semiconductor integrated circuit according to claim 1, wherein each said operative control circuitry comprises an active latch circuit responsive to a trigger signal as said selection signal to switch its stable state by its own action and once triggered to remain in that state.

3. A digital bipolar semiconductor integrated circuit according to claim 2, wherein each said latch circuit has a formation operative as two complementary transistors each connected by its base to the collector of the other and triggered at one of the base connections to latch one emitter to a particular one of two possible voltage conditions.

4. A digital bipolar semiconductor integrated circuit according to claim 2, comprising a selection transistor connected to the latch circuit for application thereto or trigger signals for selection of the conductive state of the active circuit element.

5. A digital bipolar semiconductor integrated circuit according to claim 1, wherein each said active circuit element comprises a transistor whose collector-emitter path affords the corresponding said selectable signal connection and whose control electrode is connected to said operative control circuitry for selectivity rendering the transistor conductive.

6. A digital bipolar semiconductor integrated circuit according to claim 5, wherein said logic circuitry includes at least one logic gate for which each input stage comprises a said transistor selectable as to whether such input stage is operative, said logic gate having a further transistor serving as output stage and connected in common to said transistors of its input stages.

7. A digital bipolar semiconductor integrated circuit according to claim 6, wherein said further transistor has an output serving for connection directly to said selectable signal connection provisions for input stages of other logic gates of said logic circuitry.

8. A digital bipolar semiconductor integrated circuit according to claim 1, wherein said selectable signal connection provisions are at inputs to logic gates of said logic circuitry and also at output branches therefrom.

9. A digital bipolar semiconductor integrated circuit according to claim 5, wherein each said transistor of an output branch is further coupled to an inverting transistor.

10. A digital bipolar semiconductor integrated circuit according to claim 1, wherein said operative control circuitry has input provisions for a reset signal, the operative control circuitry being responsive thereto to apply circuit conditions wherein said active circuit element reverts from any selected conduction state to a non-conduction state.

11. A digital bipolar semiconductor integrated circuit comprising logic circuitry of which each logic gate has input and output connections, wherein at least each input connection is by way of an active circuit element whose conduction state for logic signals is selectable according to conduction control signals, and each active circuit element has associated therewith an active latch circuit responsive to selection trigger signals to switch from one to another of its two stable states which other state corresponds to circuit conditions applied to the coupled said active circuit element to select its conduction state.

* * * * *